(12) United States Patent
Otsubo et al.

(10) Patent No.: US 11,961,830 B2
(45) Date of Patent: Apr. 16, 2024

(54) MODULE

(71) Applicant: Murata Manufacturing Co., Ltd., Nagaokakyo (JP)

(72) Inventors: Yoshihito Otsubo, Nagaokakyo (JP); Motohiko Kusunoki, Nagaokakyo (JP); Takanori Uejima, Nagaokakyo (JP)

(73) Assignee: MURATA MANUFACTURING CO., LTD., Kyoto-fu (JP)

( * ) Notice: Subject to any disclaimer, the term of this patent is extended or adjusted under 35 U.S.C. 154(b) by 0 days.

(21) Appl. No.: 17/651,273

(22) Filed: Feb. 16, 2022

(65) Prior Publication Data

US 2022/0173085 A1 Jun. 2, 2022

Related U.S. Application Data

(63) Continuation of application No. PCT/JP2020/029991, filed on Aug. 5, 2020.

(30) Foreign Application Priority Data

Aug. 23, 2019 (JP) .................. 2019-153116
Jul. 16, 2020 (JP) .................. 2020-122292

(51) Int. Cl.
*H01L 23/552* (2006.01)
*H01L 25/16* (2023.01)
*H01L 23/498* (2006.01)

(52) U.S. Cl.
CPC ........... *H01L 25/16* (2013.01); *H01L 23/552* (2013.01); *H01L 23/49822* (2013.01)

(58) Field of Classification Search
CPC .. H05K 1/18; H05K 1/181–187; H01L 23/00; H01L 23/28; H01L 23/50; H01L 23/552; H01L 23/49811; H01L 23/49822; H01L 24/05; H01L 24/48–49
USPC ................. 361/772–784, 795, 816, 818; 257/660–730
See application file for complete search history.

(56) References Cited

U.S. PATENT DOCUMENTS

| | | | |
|---|---|---|---|
| 8,786,083 B2 * | 7/2014 | Haba ............... | H01L 23/552 257/784 |
| 9,761,537 B2 | 9/2017 | Chen et al. | |
| 11,227,840 B2 * | 1/2022 | Otsubo ............ | H01L 25/18 |
| 11,342,276 B2 * | 5/2022 | Chung ............ | H01L 25/50 |
| 11,476,226 B2 * | 10/2022 | Uejima ............ | H03F 3/68 |
| 2005/0040501 A1 * | 2/2005 | Hagen ............ | H01L 23/3677 257/784 |

(Continued)

FOREIGN PATENT DOCUMENTS

JP H04-49631 A 2/1992
JP 2017-084898 A 5/2017

(Continued)

OTHER PUBLICATIONS

International Search Report for PCT/JP2020/029991 dated Oct. 20, 2020.
Written Opinion for PCT/JP2020/029991 dated Oct. 20, 2020.

*Primary Examiner* — Tuan T Dinh
(74) *Attorney, Agent, or Firm* — Pearne & Gordon LLP (57) ABSTRACT

A module includes: a board having a first surface; a first component and a second component mounted on the first surface; and a wire disposed to extend across the first component and having one end and the other end. The one end is connected to the second component. The wire is grounded.

13 Claims, 7 Drawing Sheets

(56) References Cited

U.S. PATENT DOCUMENTS

| | | | |
|---|---|---|---|
| 2010/0232128 A1* | 9/2010 | Haba | H01L 24/49 |
| | | | 361/783 |
| 2017/0118841 A1* | 4/2017 | Ino | H01L 23/552 |
| 2017/0263568 A1* | 9/2017 | Jeon | H01L 23/552 |
| 2018/0098416 A1* | 4/2018 | Choi | H05K 1/023 |
| 2018/0130755 A1* | 5/2018 | Lee | H01L 25/0655 |
| 2018/0166363 A1* | 6/2018 | Heppner | H01L 25/0657 |
| 2019/0393166 A1 | 12/2019 | Otsubo | |
| 2020/0365476 A1 | 11/2020 | Otsubo et al. | |

FOREIGN PATENT DOCUMENTS

| | | |
|---|---|---|
| WO | 2018/164158 A1 | 9/2018 |
| WO | 2019/156051 A1 | 8/2019 |

* cited by examiner

MODULE

CROSS REFERENCE TO RELATED APPLICATION

This is a continuation of International Application No. PCT/JP2020/029991 filed on Aug. 5, 2020, which claims priority from Japanese Patent Application No. 2019-153116 filed on Aug. 23, 2019, and Japanese Patent Application No. 2020-122292 filed on Jul. 16, 2020. The contents of these applications are incorporated herein by reference in their entireties.

BACKGROUND OF THE DISCLOSURE

Field of the Disclosure

The present disclosure relates to a module.

Description of the Related Art

U.S. Pat. No. 9,761,537 B2 (PTL 1) describes a structure in which wire bonding is used to shield electromagnetic waves. FIGS. 7 and 9 of this literature also illustrate structures in which wire bonding is performed across mounted components.

Generally, wire bonding is performed in a two-step process of first bonding and second bonding. The following description assumes that a first target portion and a second target portion are electrically connected by a wire. Initially, in the first bonding, a tip of the wire held by a tool is melted into a ball, which is then joined to the first target portion. Then, in the second bonding, the wire whose one end has already been joined to the first target portion by the first bonding is routed, and a point in the middle of the wire is pressed against the second target portion and melted and thereby joined thereto. The rest of the wire is cut.

PTL 1: U.S. Pat. No. 9,761,537 B2

BRIEF SUMMARY OF THE DISCLOSURE

Usually, inclination of the wire varies between the joined portion by the first bonding and the joined portion by the second bonding. The joined portion by the first bonding can be joined in such a way that the wire extends in a substantially perpendicular direction from the first target portion, whereas the angle formed between a surface of the second target portion and the wire is relatively small at the joined portion by the second bonding. Stated another way, the wire is inclined. When both the first target portion and the second target portion are on the surface of a board, extra space is needed in the vicinity of the second joined portion for joining the wire, in consideration of the inclination of the wire at the second joined portion.

Therefore, it is an object of the present disclosure to provide a module capable of saving as much space as possible along a surface of a board while realizing a compartment shield with wires.

In order to achieve the object described above, a module according to the present disclosure includes: a board having a first surface; a first component and a second component mounted on the first surface; and a wire disposed to extend across the first component and having one end and the other end, in which the one end is connected to the second component, and the wire is grounded.

The present disclosure can save as much space as possible along a surface of a board while realizing a compartment shield with wires.

DETAILED DESCRIPTION OF THE DISCLOSURE

A dimensional ratio shown in the drawings does not necessarily faithfully represent an actual dimensional ratio and a dimensional ratio may be exaggerated for the sake of convenience of description. A concept up or upper or down or lower mentioned in the description below does not mean absolute up or upper or down or lower but may mean relative up or upper or down or lower in terms of a shown position.

First Embodiment

Figure 1:
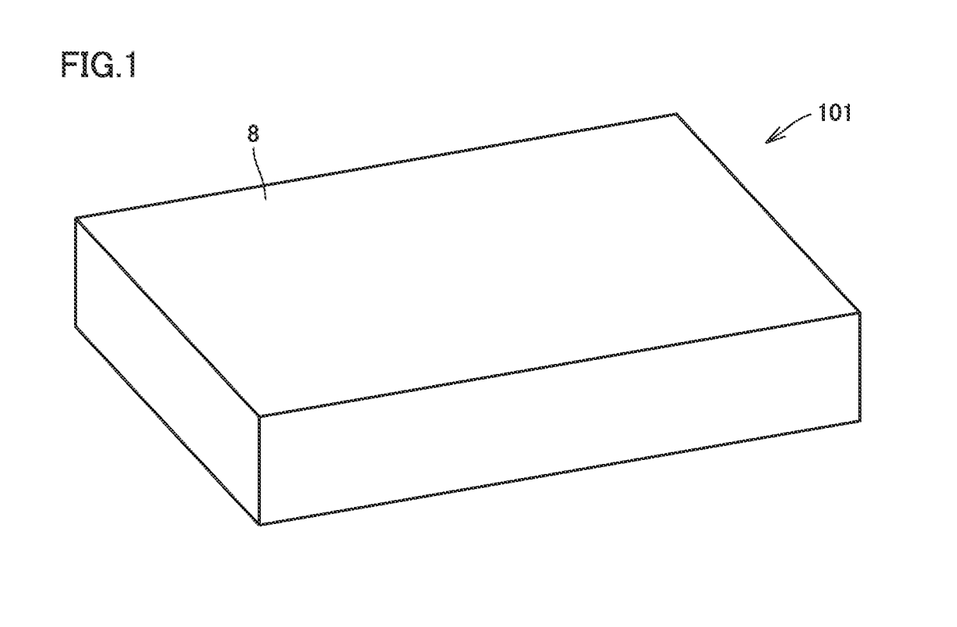
FIG. 1 is a perspective view of a module in a first embodiment according to the present disclosure.
Figure 2:
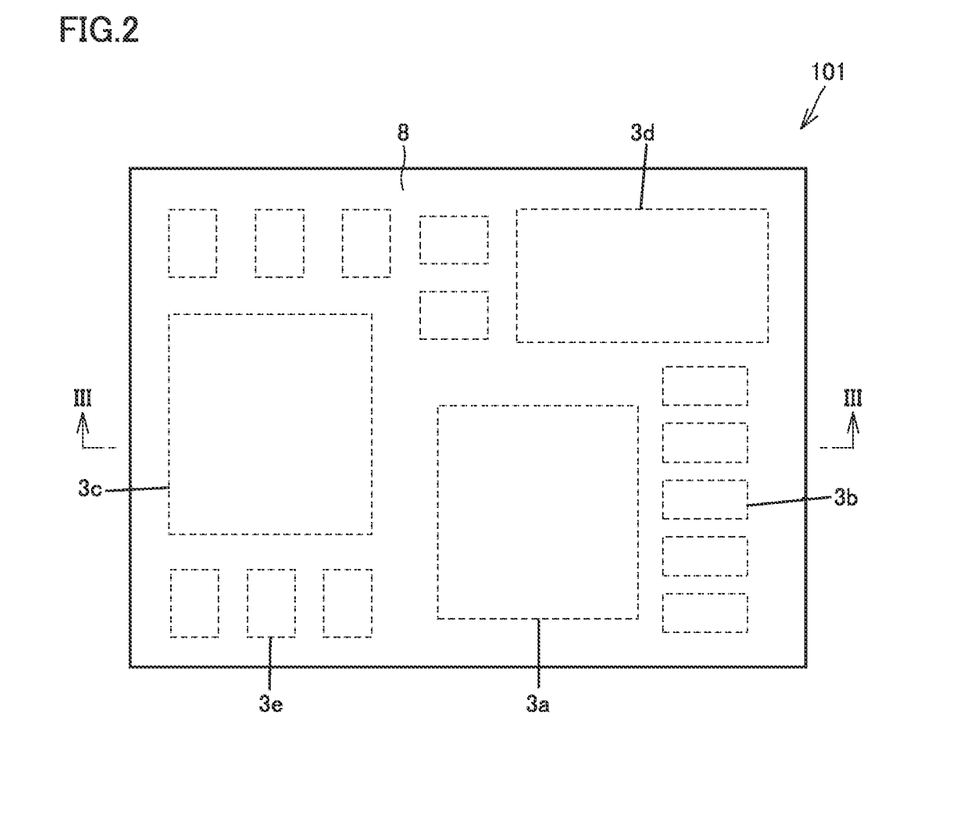
FIG. 2 is a plan view of the module in the first embodiment according to the present disclosure.
Figure 3:
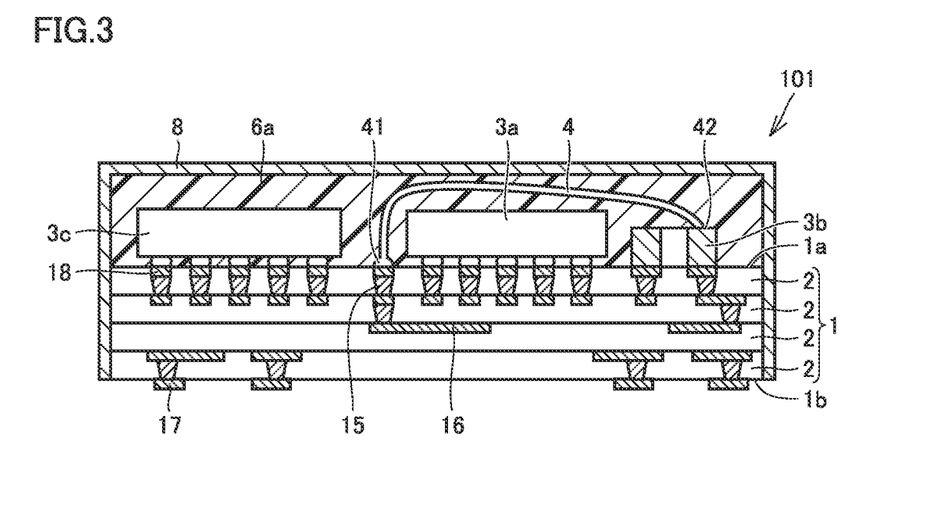
FIG. 3 is a cross-sectional view taken along a line III-III in FIG. 2.

A module in a first embodiment according to the present disclosure will be described with reference to FIGS. 1 to 6. FIG. 1 shows a perspective view of a module 101 in the present embodiment. The upper surface and the side surface of module 101 are covered with a shield film 8. FIG. 2 shows a plan view of module 101. As shown in FIG. 2, module 101 has a first component 3a, a second component 3b, and components 3c, 3d, 3e embedded therein. FIG. 3 shows a cross-sectional view taken along a line III-III in FIG. 2. Second component 3b has a substantially rectangular parallelepiped shape. Electrodes are provided at opposite end portions of second component 3b. The electrodes of second component 3b cover a part of the upper surface of second component 3b.

Module 101 in the present embodiment includes: a board 1 having a first surface 1a; first component 3a and second component 3b mounted on first surface 1a; and a wire 4 disposed to extend across first component 3a and having one end and the other end. First component 3a is an IC element, for example. More specifically, first component 3a is a low noise amplifier (LNA), for example. First component 3a may be a power amplifier (PA), for example. Second component 3b has electrodes exposed at the component surface. At least a part of the electrodes exposed at the surface of second component 3b is preferably at the upper surface of second component 3b. Second component 3b may specifically be a chip capacitor or a chip resistor, for example. Second component 3b may be, together with first component 3a, a single shield target in the module, in other words, one of a transmission circuit, a reception circuit and the like, for example.

The above-described one end is connected to second component 3b. Wire 4 is grounded. The above-described one end is a second bond end 42, and the above-described other end is a first bond end 41. In other words, the above-described one end is an end point side of wire bonding, and the above-described other end is a start point side of wire bonding. Board 1 is formed by stacking a plurality of insulating layers 2. Board 1 may be, for example, a ceramic multilayer board, or a resin multilayer board such as a printed wiring board. As illustrated herein, the portion where the above-described one end is connected to second component 3b is preferably the upper surface of second component 3b.

Additional components other than first component 3a and second component 3b may be mounted on first surface 1a of board 1. Component 3c is also mounted on first surface 1a in the example shown in FIG. 3. The plurality of components mounted on first surface 1a and wire 4 are sealed with a first sealing resin 6a. The upper surface and the side surface of first sealing resin 6a are covered with shield film 8. Shield film 8 is grounded. A conductor pattern 16 is disposed inside board 1. A conductor via 15 is electrically connected to conductor pattern 16. An external terminal 17 is provided on a second surface 1b of board 1.

Figure 4:
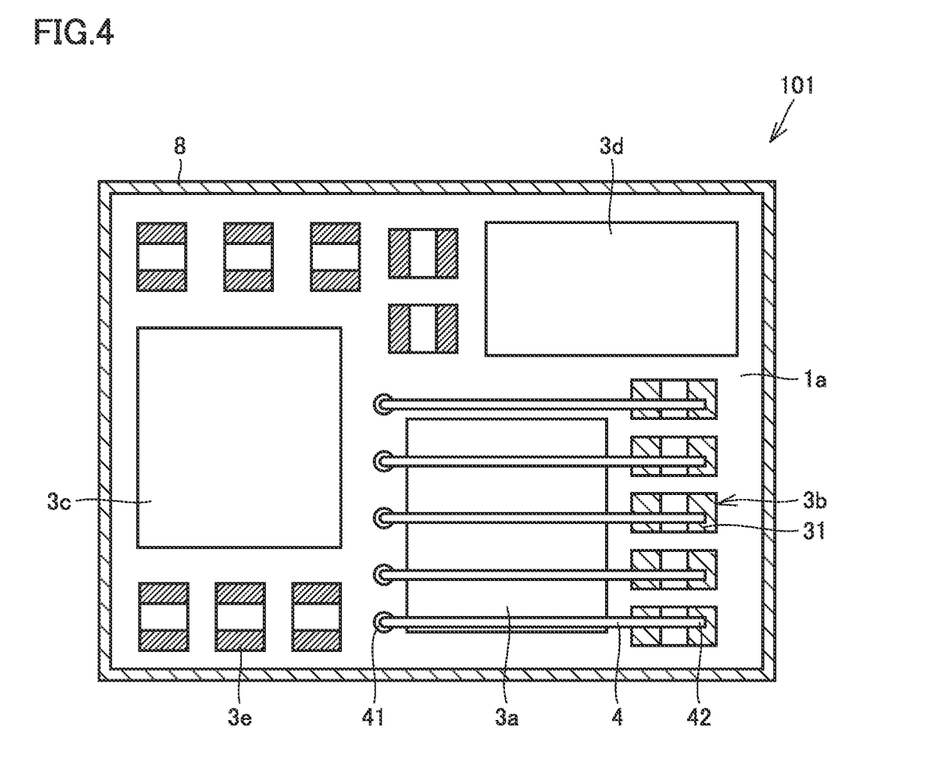
FIG. 4 is a plan view of the module in the first embodiment according to the present disclosure, with an upper surface portion of a shield film and a sealing resin removed.

FIG. 4 shows a view from directly above, with an upper surface portion of shield film 8 and sealing resin 6a removed. Components 3c and 3d are also mounted on first surface 1a. A plurality of wires 4 are disposed in parallel with one another. The plurality of wires 4 are disposed in parallel with the sides of first component 3a. A plurality of second components 3b are disposed along one side of first component 3a. The plurality of wires 4 are disposed to extend across first component 3a and a part of each of the plurality of second components 3b. However, the arrangement of second components 3b shown herein is merely illustrative and not restrictive. It is not essential that the plurality of wires be disposed in parallel, and depending on the arrangement of second components 3b, the wires may not be parallel.

Figure 5:
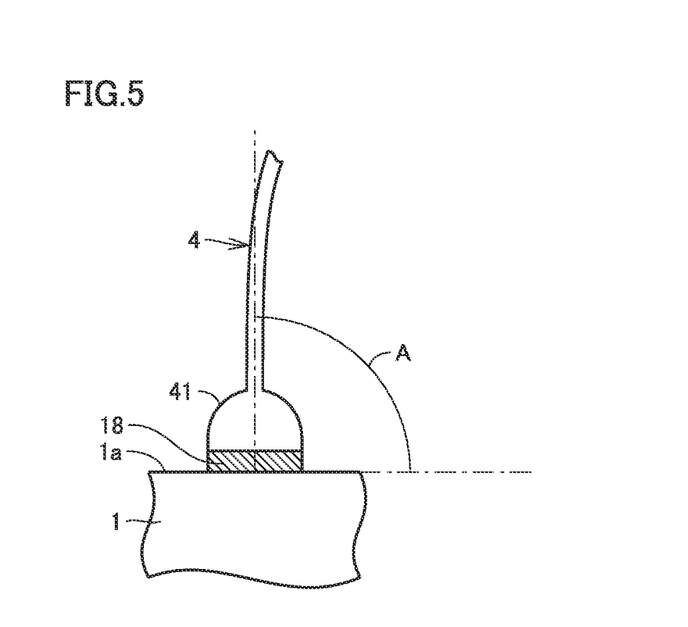
FIG. 5 is an enlarged view in the vicinity of a first bond end of a wire included in the module in the first embodiment according to the present disclosure.

FIG. 5 shows an enlarged view in the vicinity of first bond end 41 as the above-described other end. First bond end 41 is electrically connected to the upper surface of a pad electrode 18 provided on first surface 1a. As shown in FIG. 5, the material of wire 4 is formed into a hemispherical shape at first bond end 41. This hemispherically shaped object is formed by a tip of wire 4 which has been first melted into a ball, and then pressed against pad electrode 18 and solidified thereafter. At first bond end 41, wire 4 has a rising angle A.

Figure 6:
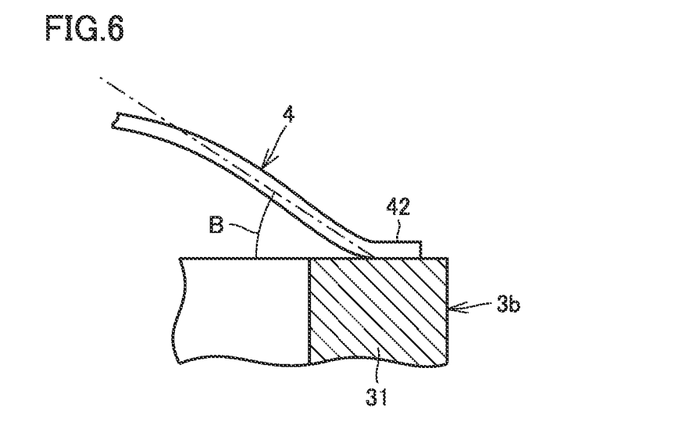
FIG. 6 is an enlarged view in the vicinity of a second bond end of the wire included in the module in the first embodiment according to the present disclosure.

FIG. 6 shows an enlarged view in the vicinity of second bond end 42 as the above-described one end. Second bond end 42 is electrically connected to an electrode 31 of second component 3b. At second bond end 42, there is almost no hemispherical portion as there was at first bond end 41. At second bond end 42, wire 4 has a rising angle B. Angle A is greater than angle B. In other words, the wire is inclined to a greater extent at the second bond side than at the first bond side. At second bond end 42, a middle portion of wire 4, not the end, is brought into contact with electrode 31, and this middle portion is melted and electrically connected to electrode 31. At second bond end 42, the rest of wire 4 is torn after wire 4 has been connected to electrode 31. At second bond end 42, a part of wire 4 is fixedly bonded to electrode 31 by being melted first and then solidified, while being disposed to lie along the surface of electrode 31.

The structures of first bond end 41 and second bond end 42 shown herein are merely illustrative and not restrictive.

The present embodiment can save as much space as possible along the surface of the board while realizing a compartment shield with the wires.

As illustrated in the present embodiment, it is preferable that second bond end 42 as the above-described one end be connected so as to form first angle B with respect to the upper surface of second component 3b, and that first bond end 41 as the above-described other end be connected to first surface 1a or the upper surface of another component so as to form second angle A greater than first angle B. This configuration can save as much space as possible along the surface of the board.

As illustrated in the present embodiment, the above-described one end is preferably the end point side of wire bonding.

As shown in FIG. 3, the height of the upper surface of second component 3b is preferably lower than the height of the upper surface of the first component. By employing this configuration, the space can be efficiently utilized to dispose the wire. The "height" as used herein refers to the height with respect to first surface 1a.

As illustrated in the present embodiment, it is preferable that second component 3b include electrode 31 at its end portion facing away from first component 3a, and that second bond end 42 as the above-described one end of wire 4 be connected to this electrode 31. By employing this configuration, a configuration in which second component 3b is also substantially inside the compartment shield can be realized. Electrode 31 is a ground terminal of second component 3b. This allows for shielding by wire 4.

As illustrated in the present embodiment, module 101 preferably includes the sealing resin that seals first component 3a and second component 3b, and shield film 8 formed to cover this sealing resin. In this case, first sealing resin 6a corresponds to the "sealing resin."

Second Embodiment

Figure 7:
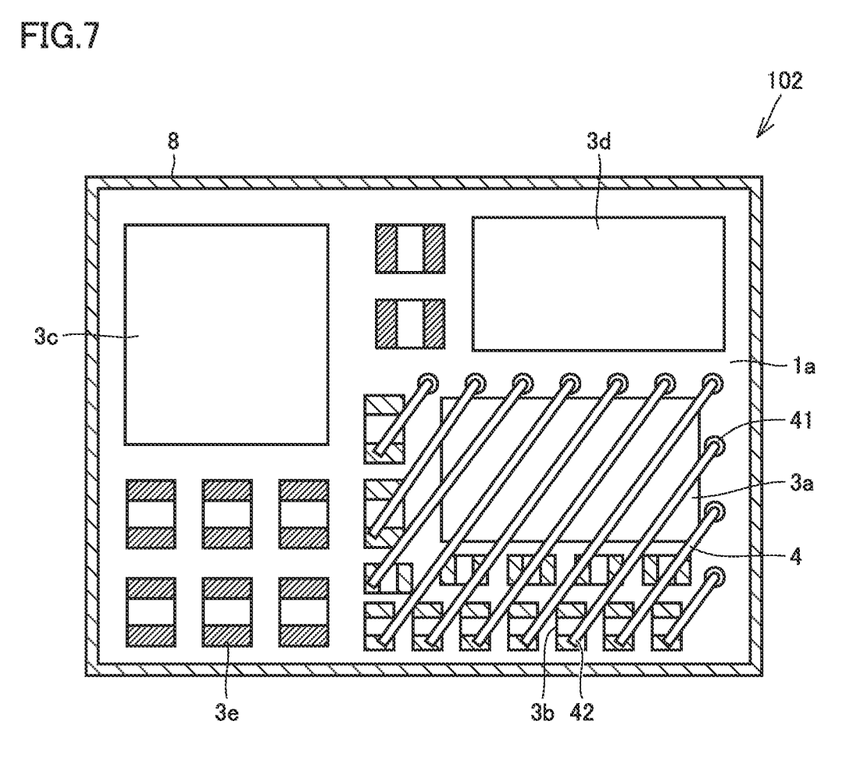
FIG. 7 is a plan view of a module in a second embodiment according to the present disclosure, with an upper surface portion of a shield film and a sealing resin removed.

A module in a second embodiment according to the present disclosure will be described with reference to FIG. 7. A module 102 in the present embodiment is the same as module 101 described in the first embodiment in terms of its basic configuration, but includes the following configuration. FIG. 7 shows a view of module 102 in the present embodiment from directly above, with the upper surface portion of shield film 8 and sealing resin 6a removed. While a plurality of wires 4 are disposed in parallel with the sides of first component 3a in the first embodiment, a plurality of wires 4 are disposed obliquely with respect to the sides of first component 3a in the present embodiment. In other words, as seen in a direction perpendicular to first surface 1a, wires 4 are disposed obliquely with respect to the sides of first component 3a.

In the present embodiment, since the plurality of wires 4 are disposed obliquely with respect to the sides of first component 3a, one of the ends of each wire 4 can be disposed along more sides of first component 3a. Therefore, the compartment shield can be made more robust.

Third Embodiment

Figure 8:
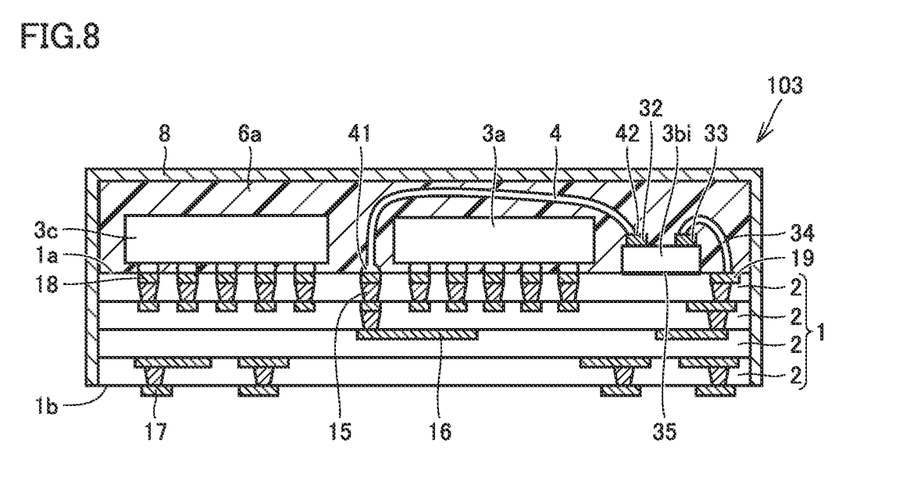
FIG. 8 is a cross-sectional view of a module in a third embodiment according to the present disclosure.

A module in a third embodiment according to the present disclosure will be described with reference to FIG. 8. FIG. 8 shows a cross-sectional view of a module 103 in the present embodiment. Module 103 in the present embodiment is the same as module 101 described in the first embodiment in terms of its basic configuration, but includes the following configuration. In module 103, a second component 3bi is mounted on first surface 1a. Second component 3bi is a die-bonded component. Second component 3bi includes electrodes 32 and 33 on its upper surface.

In module 103, second component 3bi includes electrode 32 as a connection terminal on the upper surface, second component 3bi has a lower surface 35 bonded to first surface 1a, and second bond end 42 as the above-described one end of wire 4 is connected to electrode 32 as the connection terminal. A pad electrode 19 is provided on first surface 1a of board 1. Electrode 33 and pad electrode 19 are connected by a wire 34. In this case, electrode 32 is electrically connected to electrode 33 via a circuit inside die-bonded second component 3bi. Pad electrode 19 is connected to ground through wiring (not shown) inside board 1. In other words, second component 3bi is a die-bonded component, and the module includes different wire 34 from wire 4, this different wire 34 being grounded.

The same effect as that described in the first embodiment can be produced in the present embodiment as well. In the present embodiment, wire 4 is connected to electrode 32, electrodes 32 and 22 are electrically connected, and electrode 33 is connected to pad electrode 19 by wire 34. With wire 4 being connected to ground through electrode 32, electrode 33, wire 34, and pad electrode 19 in this manner, a compartment shield can be achieved.

Fourth Embodiment

Figure 9:
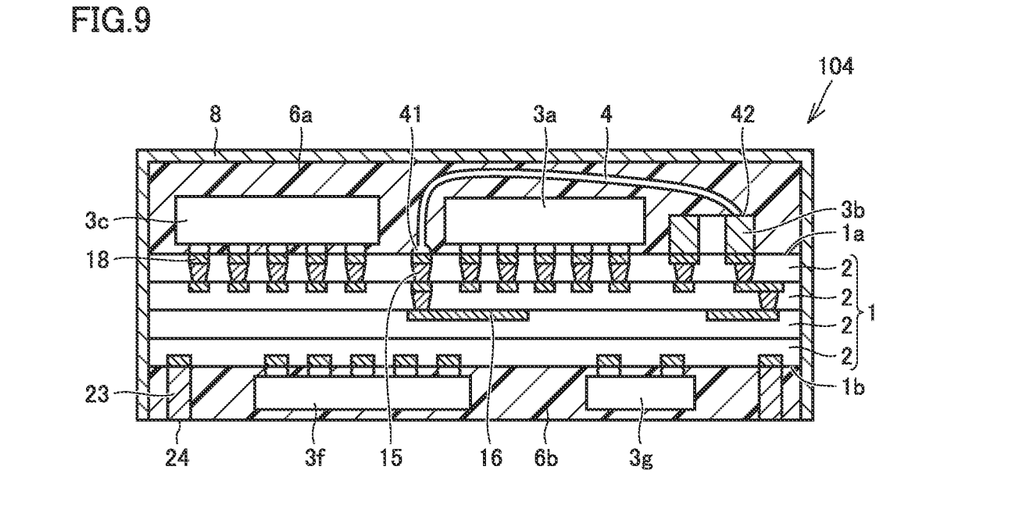
FIG. 9 is a cross-sectional view of a module in a fourth embodiment according to the present disclosure.

A module in a fourth embodiment according to the present disclosure will be described with reference to FIG. 9. FIG. 9 shows a cross-sectional view of a module 104 in the present embodiment. Module 104 in the present embodiment is the same as module 101 described in the first embodiment in terms of its basic configuration, but includes the following configuration.

Module 104 has a double-sided mounting structure. In other words, in module 104, board 1 has second surface 1b located opposite to first surface 1a, with at least one component mounted on second surface 1b. Specifically, in module 104, by way of example, components 3f and 3g are mounted on second surface 1b of board 1. Components 3f and 3g are sealed with a second sealing resin 6b. An external terminal 24 is provided on the lower surface of module 104. In the example shown herein, the lower surface of a columnar conductor 23 serves as external terminal 24. Columnar conductor 23 is disposed on second surface 1b. Columnar conductor 23 may be one of a pin, an electrode formed by plating, and a metal block. Columnar conductor 23 extends through second sealing resin 6b. A solder bump may be connected to the lower end of columnar conductor 23. The configuration of external terminal 24 shown herein is merely illustrative and not restrictive. A bump may be provided in place of columnar conductor 23.

The same effect as that described in the first embodiment can be produced in the present embodiment as well. In the present embodiment, more components can be mounted on board 1 because of the double-sided mounting structure.

Fifth Embodiment

Figure 10:
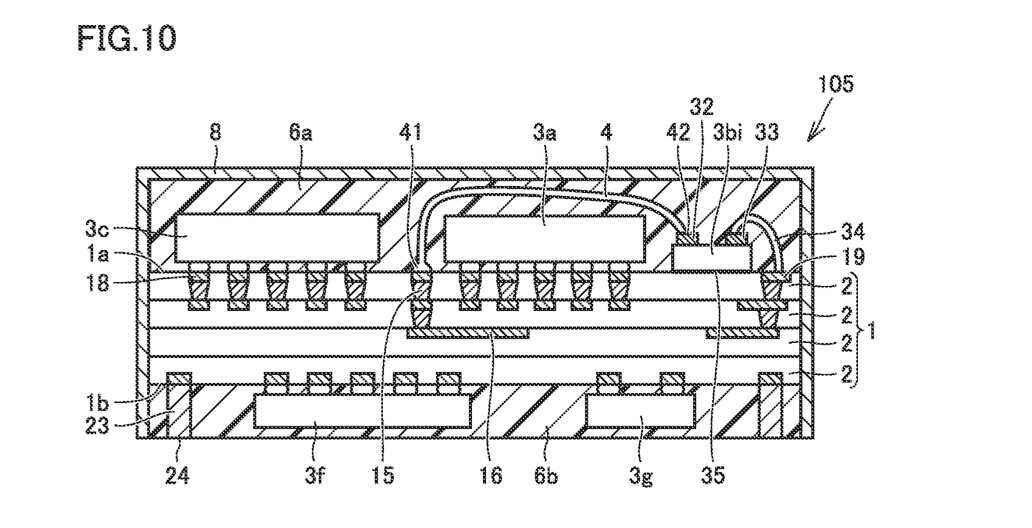
FIG. 10 is a cross-sectional view of a module in a fifth embodiment according to the present disclosure.

A module in a fifth embodiment according to the present disclosure will be described with reference to FIG. 10. FIG. 10 shows a cross-sectional view of a module 105 in the present embodiment. Module 105 in the present embodiment is the same as module 103 described in the third embodiment in terms of its basic configuration, but includes the following configuration.

Module 105 has a double-sided mounting structure. The structure on the second surface 1b side of board 1 is the same as that described in the fourth embodiment.

The same effect as that described in the third embodiment can be produced in the present embodiment as well. In the present embodiment, more components can be mounted on board 1 because of the double-sided mounting structure.

Sixth Embodiment

Figure 11:
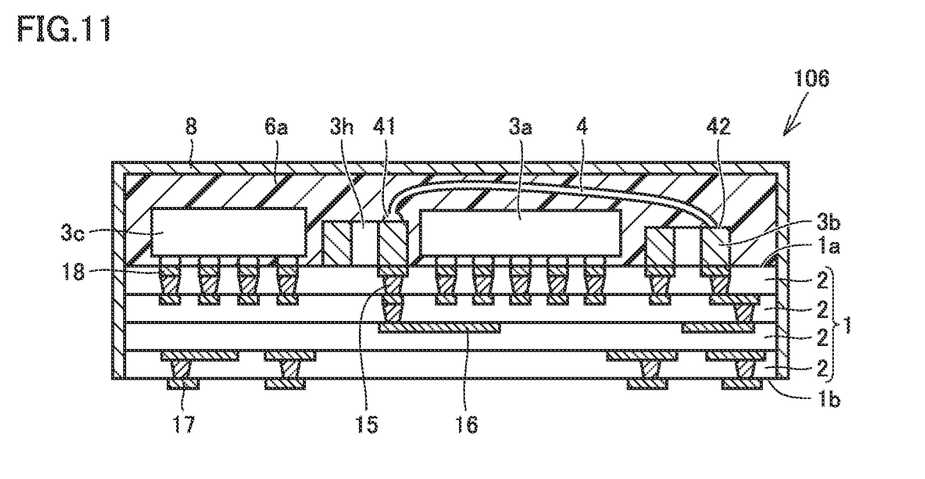
FIG. 11 is a cross-sectional view of a module in a sixth embodiment according to the present disclosure.

A module in a sixth embodiment according to the present disclosure will be described with reference to FIG. 11. FIG. 11 shows a cross-sectional view of a module 106 in the present embodiment. Module 106 in the present embodiment is the same as module 101 described in the first embodiment in terms of its basic configuration, but includes the following configuration.

In module 106 in the present embodiment, a component 3h is mounted on first surface 1a of board 1. Component 3h includes electrodes at its opposite end portions. The electrodes of component 3h cover a part of the upper surface of component 3h. While first bond end 41 as the above-described other end is electrically connected to first surface 1a in the first embodiment, first bond end 41 is electrically connected to the upper surface of component 3h in module 106 in the present embodiment. Such a configuration may also be employed.

The same effect as that described in the first embodiment can be produced in the present embodiment as well.

Seventh Embodiment

A module in a seventh embodiment according to the present disclosure will be described with reference to FIG. 12. In a module 107, components 301, 302 and 303 each as the first component are mounted on first surface 1a. Component 301 is a power amplifier (PA). Component 302 is a low noise amplifier (LNA). Component 303 is an antenna switch (ANT SW). In addition to these components, a number of electronic components are mounted on first surface 1a. For example, components 3c and 3d are mounted on first surface 1a. A matching circuit 311 for a power amplifier is mounted in the vicinity of component 301 as a power amplifier. A matching circuit 312 for a low noise amplifier is mounted in the vicinity of component 302 as a low noise amplifier. A matching circuit 313 for an antenna switch is mounted in the vicinity of component 303 as an antenna switch. In this case, each of the matching circuits is shown as two small rectangular components by way of example, but the size, the shape, and the number of components as a matching circuit are not limited thereto.

A power amplifier and the like each are mounted as a transmission device while a low noise amplifier and the like each are mounted as a reception device. An antenna switch and the like each are mounted as a common device.

A plurality of second components 3*b* are mounted in the vicinity of each of components 301, 302 and 303 each as the first component. Wires 4 are disposed to extend collectively across components 301, 302 and 303 each as the first component and their corresponding matching circuits, with one end of each wire 4 connected to the upper surface of second component 3*b*. The other end of each wire 4 is connected to first surface 1*a*. The one end of wire 4 as used herein is electrically connected to a terminal provided on the upper surface of second component 3*b*. In a plan view of module 107, wires 4 are disposed obliquely with respect to components 301, 302 and 303.

Figure 12:
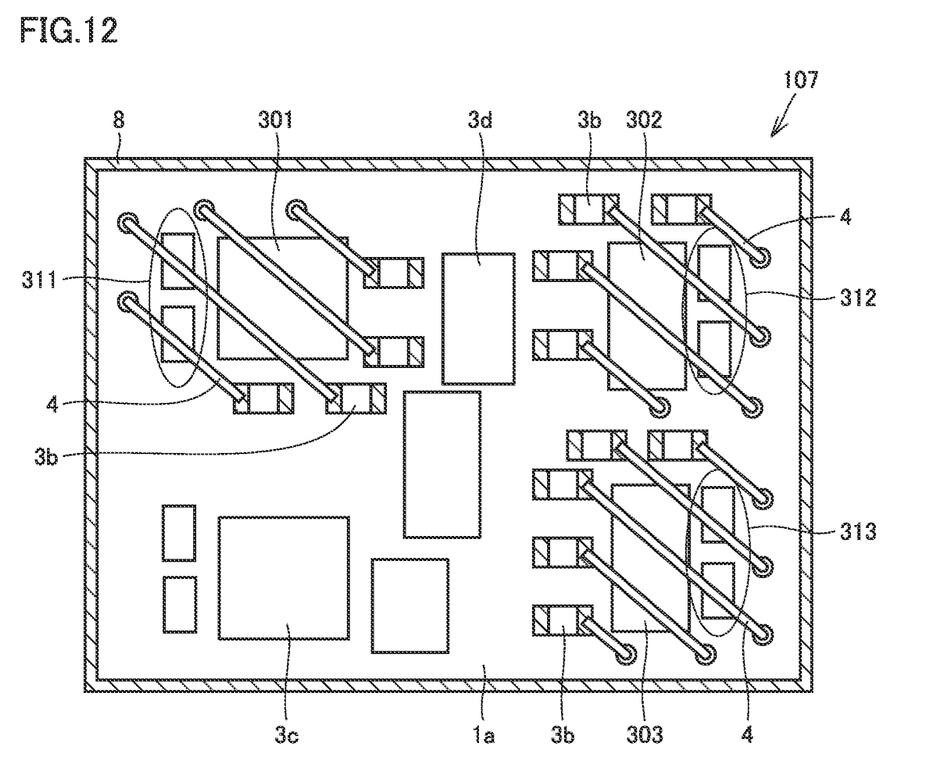
FIG. 12 is a perspective plan view of a module in a seventh embodiment according to the present disclosure.

In the example shown in FIG. 12, a plurality of wires 4 are shown for each device. In extending across component 301 as the first component, wires 4 are disposed to extend collectively across not only component 301 but also matching circuit 311 mounted in the vicinity of component 301. However, when there are a plurality of wires 4, not all of the plurality of wires 4 extend collectively across component 301 and matching circuit 311, and depending on the portion, wires 4 may extend across only one of component 301 and matching circuit 311.

In extending across component 302 as the first component, wires 4 are disposed to extend collectively across not only component 302 but also matching circuit 312 mounted in the vicinity of component 302. In extending across component 303 as the first component, wires 4 are disposed to extend collectively across not only component 303 but also matching circuit 313 mounted in the vicinity of component 303.

The isolation between devices deteriorates particularly due to magnetic flux coupling that is caused by an inductor as a matching circuit. Therefore, it is effective to surround the matching circuit with a shield in order to prevent deterioration of isolation. In the present embodiment, the devices and the matching circuits associated with the respective devices are collectively surrounded by a shield formed of a plurality of wires 4, so that deterioration of isolation can be prevented.

In the example shown in this case, the transmission device, the reception device, and the common device are divided into three groups that are surrounded for each group by respective shields each including a plurality of wires 4, but only some of these three groups of the transmission device, the reception device, and the common device may be surrounded by their respective shields each including wires 4.

Figure 13:
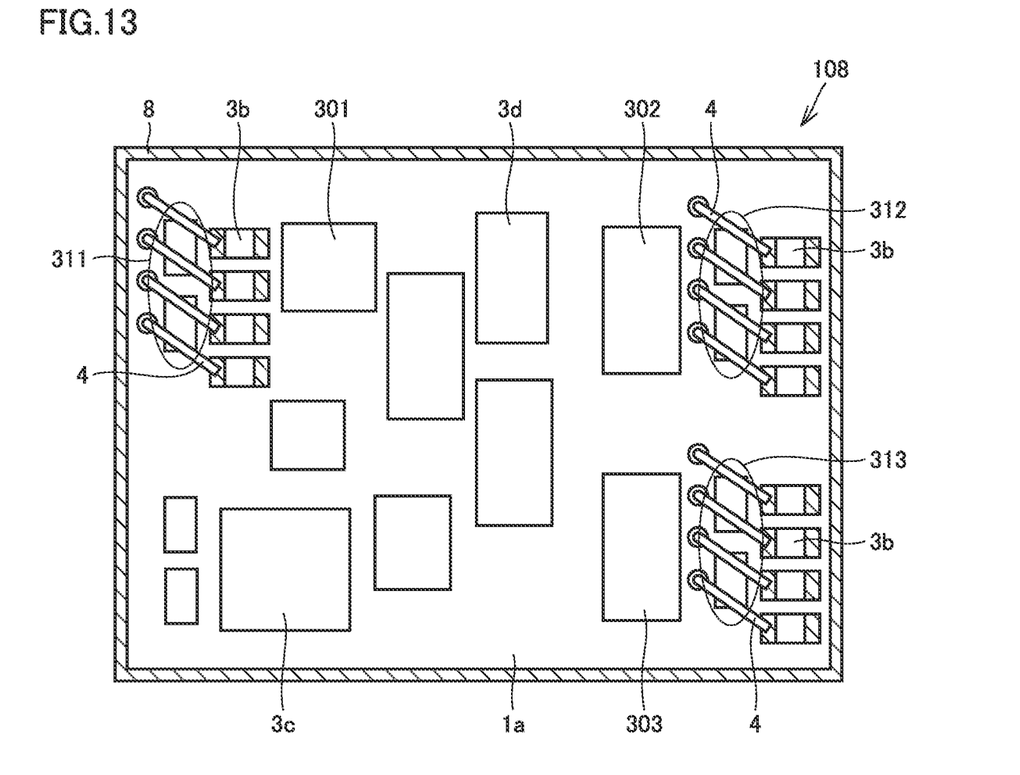
FIG. 13 is a perspective plan view of a modification of the module in the seventh embodiment according to the present disclosure.

FIG. 13 shows a modification of the module in the present embodiment. In a module 108 shown in FIG. 13, wires 4 do not extend across components 301, 302 and 303, but extend across only matching circuits 311, 312 and 313. In other words, only matching circuits 311, 312 and 313 are surrounded by their respective shields. From the viewpoint of suppressing magnetic flux coupling caused by matching circuits, it is also meaningful to shield only matching circuits 311, 312 and 313 in this way. In the case of the present modification, the same feature as described above is applicable if matching circuits 311, 312 and 313 are regarded as the first components in place of components 301, 302 and 303.

Among the above-described embodiments, one or more of the embodiments may be employed in an appropriate combination.

The above embodiments disclosed herein are illustrative and non-restrictive in every respect. The scope of the present disclosure is defined by the terms of the claims, and is intended to include any modifications within the meaning and scope equivalent to the terms of the claims.

1 board; 1*a* first surface; 1*b* second surface; 2 insulating layer; 3*a* first component; 3*b*, 3*bi* second component; 3*c*, 3*d*, 3*e*, 3*f*, 3*g*, 3*h*, 301, 302, 303 component; 4 wire; 6*a* first sealing resin; 6*b* second sealing resin; 8 shield film; 15 conductor via; 16 conductor pattern; 17, 24 external terminal; 18, 19 pad electrode; 23 columnar conductor; 31 electrode; 32, 33 electrode; 34 wire; 35 lower surface; 41 first bond end; 42 second bond end; 101, 102, 103, 104, 105, 106, 107, 108 module; 311, 312, 313 matching circuit.

The invention claimed is:

1. A module comprising:
a board having a first surface;
a first component and a second component mounted on the first surface;
a wire disposed to extend across the first component and having one end and the other end;
a sealing resin sealing the first component and the second component; and
a shield film provided to cover the sealing resin, wherein
the one end is connected to the second component at an upper surface of the second component,
the one end is connected so as to form a first angle with respect to the upper surface of the second component, and the other end is connected to an upper surface of another component so as to form a second angle greater than the first angle,
the wire is grounded, and
wherein a height of the upper surface of the second component is lower than a height of an upper surface of the first component.

2. The module according to claim 1, wherein
the one end is an end point side of wire bonding.

3. The module according to claim 1, wherein
the second component includes a connection terminal on the upper surface, the second component has a lower surface bonded to the first surface, and the one end of the wire is connected to the connection terminal.

4. The module according to claim 1, wherein
the second component includes an electrode at an end portion of the second component facing away from the first component, and the one end of the wire is connected to the electrode.

5. The module according to claim 1, wherein
as seen in a direction perpendicular to the first surface, the wire is disposed obliquely with respect to a side of the first component.

6. The module according to claim 1, wherein
the board has a second surface located opposite to the first surface, with at least one component mounted on the second surface.

7. The module according to claim 1, further comprising a matching circuit is mounted on the first surface in addition to the first component, and the wire is disposed to extend collectively across the first component and the matching circuit.

8. The module according to claim 1, wherein the first component is a matching circuit, and the wire is disposed to extend across only the first component.

9. The module according to claim 2, wherein
the second component includes a connection terminal on the upper surface, the second component has a lower surface bonded to the first surface, and the one end of the wire is connected to the connection terminal.

10. The module according to claim 3, wherein
the second component is a die-bonded component, and the module further comprises a different wire from the wire, the different wire being grounded.

11. A module comprising:
a board having a first surface;
a first component and a second component mounted on the first surface;
a wire disposed to extend across the first component and having one end and the other end;
a sealing resin sealing the first component and the second component; and
a shield film provided to cover the sealing resin, wherein
the one end is connected to the second component at an upper surface of the second component,
the one end is connected so as to form a first angle with respect to the upper surface of the second component, and the other end is connected to the first surface so as to form a second angle greater than the first angle,
the wire is grounded,
a matching circuit is mounted on the first surface in addition to the first component, and
the wire is disposed to extend collectively across the first component and the matching circuit.

12. The module according to claim 11, wherein
the one end is an end point side of wire bonding.

13. The module according to claim 11, wherein
the second component includes a connection terminal on the upper surface, the second component has a lower surface bonded to the first surface, and the one end of the wire is connected to the connection terminal.

* * * * *